(12) United States Patent
Pitschi et al.

(10) Patent No.: US 7,884,686 B2
(45) Date of Patent: Feb. 8, 2011

(54) COMPONENT OPERATING ON ACOUSTIC WAVES

(75) Inventors: Maximilian Pitschi, Rottach-Egern (DE); Juergen Kiwitt, Munich (DE)

(73) Assignee: EPCOS AG, Munich (DE)

( * ) Notice: Subject to any disclaimer, the term of this patent is extended or adjusted under 35 U.S.C. 154(b) by 162 days.

(21) Appl. No.: 12/094,715

(22) PCT Filed: Nov. 16, 2006

(86) PCT No.: PCT/DE2006/002014

§ 371 (c)(1),
(2), (4) Date: Jun. 20, 2008

(87) PCT Pub. No.: WO2007/059735

PCT Pub. Date: May 31, 2007

(65) Prior Publication Data

US 2008/0290965 A1    Nov. 27, 2008

(30) Foreign Application Priority Data

Nov. 25, 2005  (DE) ............... 102 005 056 340

(51) Int. Cl.
*H03H 1/00*  (2006.01)
*H03H 9/05*  (2006.01)
(52) U.S. Cl. .................... 333/133; 333/193
(58) Field of Classification Search .......... 333/133, 333/193, 194, 195, 196
See application file for complete search history.

(56) References Cited

U.S. PATENT DOCUMENTS

| 6,791,437 | B2 | 9/2004 | Hagn et al. |
| 7,102,460 | B2 | 9/2006 | Schmidhammer et al. |
| 7,149,496 | B2* | 12/2006 | Horiuchi et al. ............. 455/333 |
| 7,398,059 | B2* | 7/2008 | Uejima et al. ................ 455/78 |

FOREIGN PATENT DOCUMENTS

| DE | 103 17 969 | 11/2004 |
| EP | 1 296 453 | 3/2003 |
| EP | 1 592 130 | 11/2005 |
| JP | 5-167389 | 7/1993 |
| WO | WO01/71911 | 9/2001 |

OTHER PUBLICATIONS

EPCOS AG, Munich "B4219 Low Loss Dual band Filter for Mobile Communications" SAW Components-Data Sheet, Feb. 6, 2002, pp. 1-12 XP-002435071.
EPCOS AG, Munich "B7639 Low Loss Filter for Mobile Communications" SAW Components-Data Sheet, Aug. 31, 2005, pp. 1-8 XP-002424995.

(Continued)

*Primary Examiner*—Dean O Takaoka
(74) *Attorney, Agent, or Firm*—Fish & Richardson P.C.

(57) ABSTRACT

A component operating with acoustic waves is described herein. The component includes a substrate having an underside subdivided into a center area and an edge area surrounding the center area on all sides. The component also includes a plurality of outer terminals in the edge area, and a plurality of inner terminals in the center area comprising at least a first inner terminal configured as a signal terminal.

17 Claims, 2 Drawing Sheets

OTHER PUBLICATIONS

Fleckenstein A. et al. "Design Study on a Compact, High Performance SAW Duplexer" IEEE Ultrasonics Symp. Sep. 18-21, 2005, pp. 577-580 XP-010898806, ISBN 0-7803-9382-1.

Fujitsu Standart Specification—PCS-Rx (50/150) FAR-F6EB1G9600-B2BE (Version 1.1h) Nov. 10, 2003, pp. 1-7, XP-002435072.

J. Heyen et al. "Novel LTCC/BGA Modules for Highly Integrated Millimeter-Wave Transceivers" IEEE transactions on Microwave Theory and Techniques, vol. 51, No. 12, Dec. 2003 pp. 2589-2596 XP-001046452.

Satoshi Ichikawa et al "Mode Analysis of Longitudinal Multi Mode SAW Resonator Filter" 2001 IEEE Ultrasonics Symp. vol. 2, Oct. 7-10, 2001, pp. 101-106, XP 010584488, ISBN 0-7803-7177-1.

Hans Meier et al "Miniaturization and Advanced Functionalities of SAW Devices" IEEE Transactions on Microwave Theory and Techniques, vol. 49, No. 4 Apr. 2001, XP011038306.

David Chase "Achieving Signal Integrity for ASICs, PCBs and Packages" EEdesign, Dec. 19, 2003 pp. 1-6. XP-002424996.

Search Report for PCT/DE2006/002014 date mailed Jun. 12, 2007.

Written Opinion with English translation for PCT/DE2006/002014 date mailed Jun. 12, 2007.

* cited by examiner

COMPONENT OPERATING ON ACOUSTIC WAVES

CROSS REFERENCE TO RELATED APPLICATIONS

Pursuant to 35 USC §120, this application claims the benefit of PCT/DE2006/002014 filed Nov. 16, 2006 which claims the benefit of German Patent Application No. 102005056340.6 filed Nov. 25, 2005. Each of these applications is incorporated by reference in its entirety.

BACKGROUND

Components operating with acoustic waves are known for instance from the publication U.S. Pat. No. 6,791,437 B2.

SUMMARY

A problem to be solved is to specify a component with a low crosstalk between two signal paths to be separated from one another.

According to a first preferred embodiment, a component operating with acoustic waves is specified comprising a substrate, the underside of which is divided into an edge area and a center area surrounded on all sides by the latter. Outer terminals are arranged in the edge area and an arrangement of inner terminals is arranged in the center area. The arrangement of inner terminals comprises at least one first inner terminal, which is provided as a signal terminal.

The terminals of the component are also referred to as pins or solder pads. Terminals that are arranged in two mutually perpendicular preferred directions between two other terminals of the pattern of terminals, known as a footprint, are referred to as inner terminals. The preferred directions are, for example, defined parallel to the edges of the substrate's underside. Those terminals which are arranged in the edge area of the substrate underside (or outside the center area) are referred to as outer terminals.

In one variant, the arrangement of inner terminals has at least one second inner terminal which is provided as a ground terminal. A (first or second) inner terminal is positioned such that that it lies in each of two mutually perpendicular directions between two other terminals, e.g., between two outer terminals.

The substrate is, for example, a multilayer substrate with metallization planes, between which dielectric layers are arranged. The substrate is an LTCC substrate, for example. A chip having components operating with surface acoustic waves and/or bulk acoustic waves is preferably mounted on the substrate.

In one variant, a duplexer circuit that comprises a transmit filter and a receive filter is in the component. These filters have acoustic resonators that are arranged in the chip or on the chip, for example. The filters are electrically connected to the inner and the outer terminals of the component via electrical connections integrated into the substrate. The duplexer circuit can have an antenna-side matching network, e.g., a transmission line arranged in the receive path. This matching network is preferably integrated into the substrate, with its LC elements or line segments being realized, for instance, by conductor tracks or conductor areas arranged in the metallization planes.

According to the second preferred embodiment, a component operating with acoustic waves is specified, comprising a substrate, on the underside of which first signal terminals and second signal terminals are arranged. The center points of the at least two second signal terminals lie substantially on an imaginary center line that runs in the center between two first signal terminals.

The first signal terminals are preferably assigned to a balanced port that is connected, for example, to a receive path with symmetrical signaling. The second terminals are preferably each assigned to a single-ended port.

In one variant, the component comprises a duplexer with an antenna terminal, a transmit input and a receive output. The receive output is preferably assigned to the balanced port. One of the second signal terminals is provided as an antenna terminal, the other second signal terminal being assigned to the transmit input.

The arrangement of the antenna terminal between the signal terminal of the transmit path and the signal terminals of the receive path is considered advantageous.

A first ground terminal can be arranged between the antenna terminal and the signal terminal of the transmit input. A second ground terminal can be arranged between the antenna terminal and the signal terminals of the receive output. Preferably each of these ground terminals has a larger surface area than the first and second signal terminals. Additional inner or outer ground terminals can also be provided, preferably also having a larger surface area than the signal terminals. Additional signal terminals can also be present.

In one variant, the terminals comprise two successive terminals with different surface areas, wherein the terminal with a smaller surface area is provided as a signal terminal, and the terminal with the larger surface area is provided as a ground terminal. The terminals comprise for example, at least two successive terminals with differing widths, wherein the terminal with the smaller width is provided as a signal terminal and the terminal with the greater width is provided as a ground terminal.

According to the second preferred embodiment, a component operating with acoustic waves is specified, comprising a substrate, the underside of which comprises at least three terminals arranged one alongside the other in a preferred direction, wherein at least two of these terminals have widths differing from one another relative to the preferred direction. The ratio of the differing widths lies between 1 and 2 in an advantageous variant, but can in principle also be greater than two.

A grounding surface, which is arranged in the substrate and is provided for shielding the circuit elements integrated into the substrate (in particular, the matching network of the duplexer), can be connected to a ground terminal. A grounding surface, for example arranged on the rear side of the chip that is provided for shielding the component structures integrated in the chip can also be connected to a ground terminal.

The terminal with the smaller surface area or width can be provided in all preferred embodiments of the component as a signal terminal, and the terminal with the larger surface area can be provided as a ground terminal. It is advantageous to select an average size of the terminals provided as signal terminals to be smaller than an average size of the terminals provided as ground terminals.

The terminals arranged on the underside of the component can be suitable for surface mounting in all preferred embodiments.

In all preferred embodiments of the component, the underside of the carrier substrate can comprise an arrangement of terminals arranged one alongside the other in one direction, wherein the distances between successive terminals can differ from one another. It is provided that, in particular, relative to at least one preferred direction, the distance between a signal terminal and the adjacent terminals (ground terminals or at least one additional signal terminal) is selected to be greater than the distance between two ground terminals arranged one alongside the other relative to a preferred direction.

The arrangement of terminals arranged one alongside the other in a preferred direction can optionally have terminals that are offset with respect to one another perpendicular to the preferred direction, so that their centers do not lie on one line. It is also possible, however, for the terminals of this arrangement to form a row, wherein their centers or edges (e.g., edges facing inward or outward with respect to the center of the substrate) lie on an imaginary line.

DESCRIPTION OF THE DRAWINGS

The specified component will be described below on the basis of schematic figures not drawn to scale.

DETAILED DESCRIPTION

Figure 1:
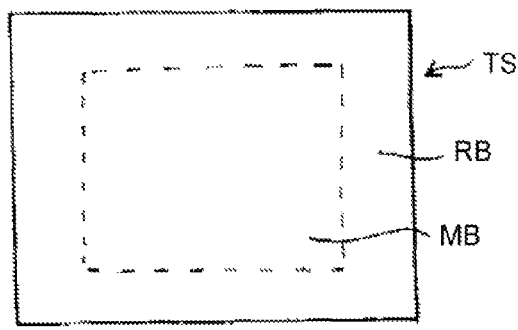
FIG. 1 shows the plan view onto the underside of the component, and its subdivision into an edge area and a center area.
Figure 3:
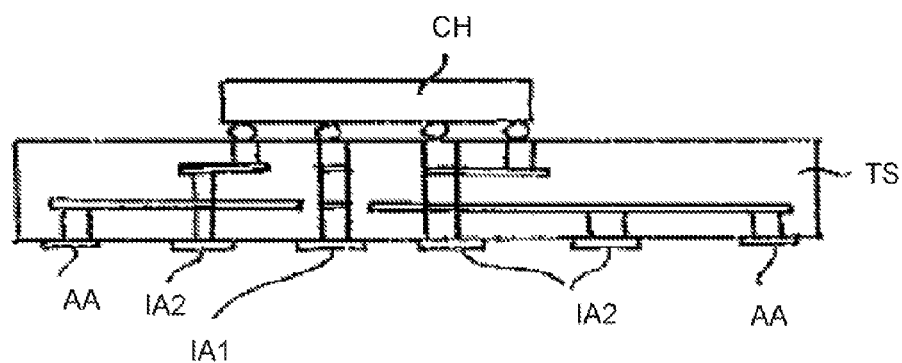
FIG. 3, a component in cross section with an acoustic chip that is mounted on a carrier substrate, on the underside of which inner terminals are provided.

FIG. 1 shows an imaginary subdivision of the underside of a carrier substrate TS, shown in FIG. 3 for instance, with an edge area RB and a center area MB. Edge area RB is an area having the shape of a frame that faces the outer edges of the carrier substrate. Edge area RB is an area that is free of inner terminals IA1, IA2. On the other hand, the center area is an area that is free of outer terminals AA. Terminals AA, IA1 and IA2 are SMD terminals.

Figure 2:
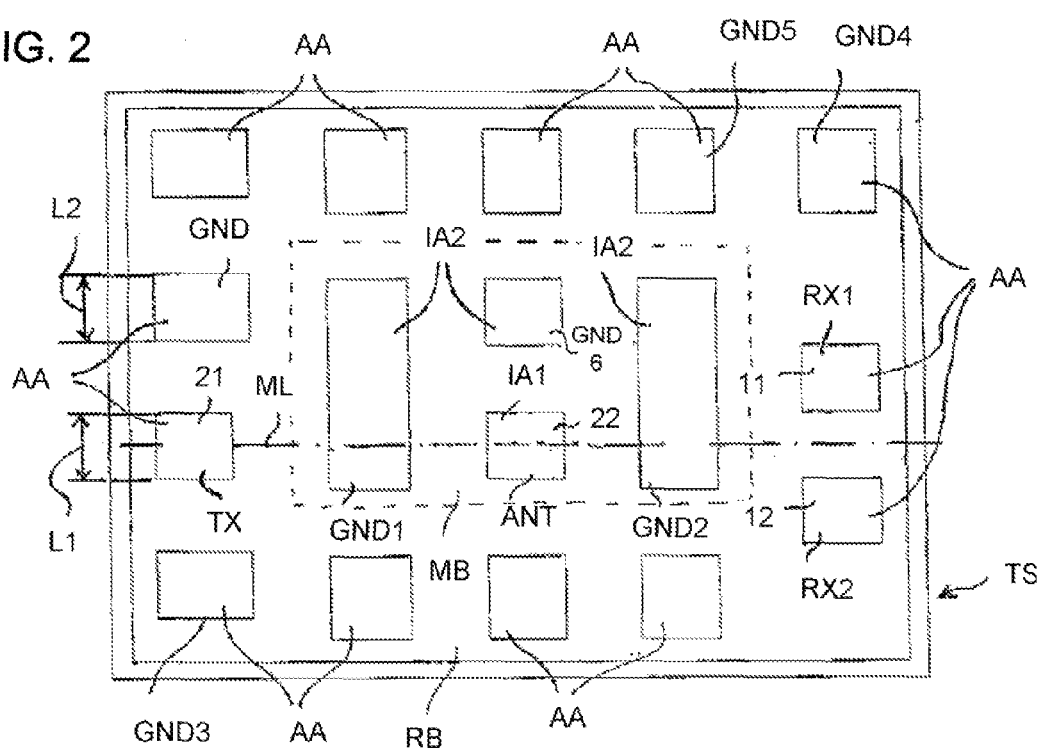
FIG. 2, an example of a footprint with a pin matrix having inner terminals.

FIG. 2 shows the footprint (terminal arrangement) of a component operating with acoustic waves in which a duplexer circuit is realized. The footprint is realized in the lowermost metallization plane of substrate TS.

Outer terminals AA are arranged in edge area RB, and a first inner terminal IA1 and several second inner terminals IA2 are arranged in center area MB. The ratio of the widths of the center area and the edge area can in principle be arbitrary. The width of the edge area is substantially determined by the length of the outer terminals AA, or the longest of these terminals. The connecting points between terminals IA1, IA2 and contact areas, not shown in the figures, of an external circuit board can be solder pads or bumps, for example.

Terminal IA1 is a signal terminal and terminals IA2 are ground terminals. Terminal IA1 in this case is an antenna terminal ANT. All terminals form a footprint in the form of a pin matrix that has several rows and five columns.

Successive terminals in the horizontal direction form a row and successive terminals in the vertical direction form a column. For example, the successive terminals GND, GND1, GND6 and GND2 form one row and the terminals TX, GND1, ANT and GND2 form an additional row. Terminals GND1, GND2 and RX1 follow one another in a horizontal direction and therefore form a row. In principle the columns can be interchanged with the rows in case of a rotation of the footprint by 90°, for example.

The first ground terminal GND 1 serves to shield antenna terminal ANT from the unbalanced-to-ground transmit input, which has a signal terminal TX. The second ground terminal GND2 serves to shield antenna terminal ANT from the ground-symmetric receive output, which has two signal terminals RX1, RX2.

Additional ground terminals, including terminals GND3, GND4, GND5, are provided. Apart from the signal terminals RX1, RX2, TX and ANT, all other terminals are preferably connected to ground. The surface area of the signal terminals RX1, RX2, TX and ANT is smaller than the surface area of the ground terminals. It is possible for example, to select the width L1 of signal terminal TX, measured in the vertical direction, to be smaller than the width L2 measured in this direction of the ground terminals GND, GND3 adjacent to this signal terminal.

The distance between signal terminal TX and the adjacent terminals GND, GND1, GND3 is preferably larger than the distance between two ground terminals, e.g., between terminals GND and GND1 or GND4 and GND5. This also applies to the signal terminals ANT, RX1 and RX2.

The surface area of the ground terminals GND1, GND2 provided between two hot terminals is selected to be greater than the surface area of other ground terminals, which serve, for instance, for ground contact with a ground contact area in substrate TS.

The dimensioning and positioning of the terminals of a footprint explained in connection with FIG. 2, in particular, the relative dimensioning and positioning of the signal and ground terminals, represent measures according to the third preferred embodiment of the component.

The footprint shown in FIG. 2 has, according to the second preferred embodiment of the component, first signal terminals 11, 12 and second signal terminals 21, 22. The center points of second signal terminals 21, 22 lie on an imaginary center line ML that runs in the middle between two first signal terminals 11, 12.

The first terminals are preferably equally large and are mirror-symmetrically arranged relative to line ML, which runs through the centers of second terminals 21, 22. Thus the same distance of the two first terminals 11, 12 from terminal 21 and from terminal 22 is guaranteed.

First terminals 11, 12 in the variant according to FIG. 2 are signal terminals RX1, RX2 of a first ground-symmetric receive output. Second terminal 21 is a signal terminal TX of an unbalanced-to-ground transmit input. The additional second terminal 22 is an antenna terminal ANT, thus also a signal terminal of an unbalanced-to-ground electric port.

FIG. 3 shows an example of a component in cross section. The component comprises a substrate TS and a chip CH arranged thereon which comprises component structures operating with acoustic waves.

Substrate TS comprises several dielectric layers, e.g., LTCC layers. The dielectric layers of the substrate are arranged between metallization planes. The metallization planes are conductively connected to one another by means of plated through-holes. The metallization planes comprise circuit elements such as inductors, capacitors, or transmission lines, including the transmission line TL shown in FIG. 4.

The outer and inner terminals AA, IA1, IA2 of the component, which were already shown in FIG. 2, are formed in the lowest metallization plane of carrier substrate TS. In its uppermost metallization plane, contact areas are formed which can be connected to the terminal areas of chip CH by means of bumps in a flip chip arrangement of chip CH. The electrical connection between the contact areas of carrier substrate TS and the terminal areas of chip CH is alternatively possible by means of bond wires, in case the rear side of the chip faces towards the carrier substrate.

Figure 4:
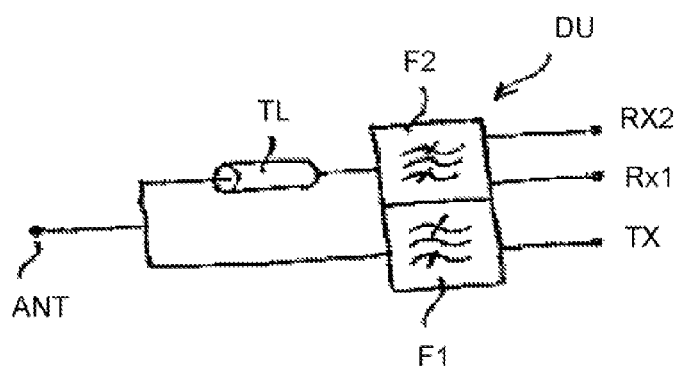
FIG. 4, a circuit with a duplexer realized in the component according to FIGS. 2, 3.

FIG. 4 shows a front end circuit with a signal path that comprises an antenna path (transmit-receive path) connected to an antenna terminal ANT, a transmit path connected to a transmit input TX and a receive path connected to a receive output RX1, RX2.

Duplexer DU comprises a transmit filter F1 arranged in the transmit path, a receive filter F2 arranged in receive path RX, and a matching network that can comprise a transmission line TL arranged in the receive path.

Transmission line TL preferably has a quarter wavelength at the transmit frequency associated with the signal path. A λ/4 line emulated by LC elements can be used in place of transmission line TL. These LC elements are preferably integrated in substrate TS. Alternatively the matching network can also have, for instance, a parallel inductor and a series capacitor.

The filters F1, F2 associated with duplexer DU each comprise BAW resonators and/or at least one SAW transducer. The resonators or transducers can be interconnected in a ladder-type arrangement, for example.

A balun is integrated in receive filter F2 in the variant shown in FIG. 4. It is also possible to connect a balun, which is preferably integrated in substrate TS, on the output side of receive filter F2 with a single-ended output.

Different measures explained above for designing a footprint can be arbitrarily combined with one another.

The invention claimed is:

1. A component operating with acoustic waves, comprising:
   a substrate comprising:
      a first pair of signal terminals associated with a balanced port; and
      a second pair of signal terminals on an underside of the substrate, the second pair of signal terminals being assigned to a single-ended port;
   wherein centers of the signal terminals of the second pair of signal terminals are on a center line between the signal terminals of the first pair of signal terminals.

2. The component of claim 1, further comprising:
   a duplexer having an antenna terminal, a transmit input, and a receive output;
   wherein the receive output is associated with the balanced port; and
   wherein the second pair of signal terminals comprise a first terminal and a second terminal, the first terminal being configured as the antenna terminal and the second terminal being associated with the transmit input.

3. The component of claim 2, wherein the antenna terminal is between a signal terminal of the transmit input and signal terminals of the receive output.

4. The component of claim 3, further comprising:
   a first ground terminal between the antenna terminal and the signal terminal of the transmit input; and
   a second ground terminal between the antenna terminal and the signal terminals of the receive output.

5. The component of claim 4,
   wherein the first and the second ground terminals have a first surface area; and
   wherein the signal terminals of the first pair of signal terminals and the signal terminals of the second pair of signal terminals have a second surface area, the first surface area being larger than the second surface area.

6. A component operating with acoustic waves, comprising:
   a substrate having an underside subdivided into a center area and an edge area surrounding the center area on all sides,
   a plurality of outer terminals in the edge area;
   a plurality of inner terminals in the center area comprising at least a first inner terminal configured as a signal terminal; and
   a plurality of ground and signal terminals configured one alongside the other in one direction having a varying distance between successive terminals;
   wherein a distance between at least one of the signal terminals and each of a plurality of terminals adjacent to the at least one of the signal terminals is selected to be larger than the distance between two adjacent ground terminals.

7. The component of claim 6, wherein the plurality of inner terminals comprise at least a second inner terminal configured as a ground terminal.

8. The component of claim 7,
   wherein the plurality of outer and inner terminals on the underside of the substrate form a pin matrix; and
   wherein the first and the second inner terminals are in each of two mutually perpendicular directions between two other terminals of the pin matrix.

9. The component of claim 6, further comprising:
   a chip mounted on the substrate having component structures and operating with surface acoustic waves.

10. The component of claim 9, further comprising:
    a duplexer circuit having a transmit filter and a receive filter;
    wherein the transmit filter and the receive filter are in the chip or on the chip, and connected to at least some of the plurality of outer and inner terminals via electrical connections integrated in the substrate.

11. The component of claim 6, further comprising:
    a chip mounted on the substrate having component structures and operating with bulk acoustic waves.

12. The component of claim 11, further comprising:
    a duplexer circuit having a transmit filter and a receive filter;
    wherein the transmit filter and the receive filter are in the chip or on the chip, and connected to the plurality of outer and inner terminals of the component via electrical connections integrated in the substrate.

13. The component of claim 6,
    wherein the plurality of outer and inner terminals comprise at least two successive first and second terminals with different widths; and
    wherein the first terminal is configured as a signal terminal and has a first width, and the second terminal is configured as a ground terminal and has a second width, the first width being smaller than the second width.

14. The component of claim 6,
    wherein the plurality of outer and inner terminals comprise at least two successive first and second terminals with different surface areas; and
    wherein the first terminal is configured as a signal terminal and has a first surface area, and the second terminal configured as a ground terminal has a second surface area, the first surface area being smaller than the second surface area.

15. The component of claim 6, wherein the plurality of outer and inner terminals on the underside are suitable for surface mounting.

16. The component of claim 6,
    wherein the plurality of outer and inner terminals are configured as signal terminals and have a first average size; and wherein the plurality of outer and inner terminals are configured as ground terminals and have a second average size, the first average size being smaller than the second average size.

17. A component operating with acoustic waves, comprising:
   a substrate having an underside subdivided into a center area and an edge area surrounding the center area on all sides,
   a plurality of outer terminals in the edge area;
   a plurality of inner terminals in the center area comprising at least a first inner terminal configured as a signal terminal; and
   a plurality of ground and signal terminals configured one alongside the other in one direction having a varying distance between successive terminals;

wherein:
   a distance between at least one of the signal terminals and an adjacent terminal is selected to be larger than the distance between two adjacent ground terminals;
   the plurality of outer and inner terminals comprise at least two successive first and second terminals with different surface areas; and
   the first terminal is configured as a signal terminal and has a first surface area, and the second terminal configured as a ground terminal has a second surface area, the first surface area being smaller than the second surface area.

* * * * *

UNITED STATES PATENT AND TRADEMARK OFFICE
CERTIFICATE OF CORRECTION

| | | |
|---|---|---|
| PATENT NO. | : 7,884,686 B2 | Page 1 of 1 |
| APPLICATION NO. | : 12/094715 | |
| DATED | : February 8, 2011 | |
| INVENTOR(S) | : Maximilian Pitschi and Juergen Kiwitt | |

It is certified that error appears in the above-identified patent and that said Letters Patent is hereby corrected as shown below:

Title Page, Item (30) Foreign Application Data, delete "102 005 056 340" and insert -- 10 2005 056 340 --, therefor.

Signed and Sealed this
Twelfth Day of April, 2011

David J. Kappos
*Director of the United States Patent and Trademark Office*